United States Patent
Wang et al.

(10) Patent No.: US 10,446,555 B2
(45) Date of Patent: Oct. 15, 2019

(54) BURIED METAL TRACK AND METHODS FORMING SAME

(71) Applicant: Taiwan Semiconductor Manufacturing Company, Ltd., Hsinchu (TW)

(72) Inventors: Pochun Wang, Hsinchu (TW); Ting-Wei Chiang, New Taipei (TW); Chih-Ming Lai, Hsinchu (TW); Hui-Zhong Zhuang, Kaohsiung (TW); Jung-Chan Yang, Longtan Township (TW); Ru-Gun Liu, Zhubei (TW); Shih-Ming Chang, Zhubei (TW); Ya-Chi Chou, Hsinchu (TW); Yi-Hsiung Lin, Zhubei (TW); Yu-Xuan Huang, Hsinchu (TW); Yu-Jung Chang, Hsinchu (TW); Guo-Huei Wu, Tainan (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 15/691,974

(22) Filed: Aug. 31, 2017

(65) Prior Publication Data
US 2019/0067290 A1 Feb. 28, 2019

(51) Int. Cl.
| H01L 27/108 | (2006.01) |
| H01L 21/768 | (2006.01) |
| H01L 23/522 | (2006.01) |
| H01L 23/528 | (2006.01) |
| H01L 27/02 | (2006.01) |

(52) U.S. Cl.
CPC .. *H01L 27/10823* (2013.01); *H01L 21/76897* (2013.01); *H01L 23/522* (2013.01); *H01L 23/528* (2013.01); *H01L 27/0207* (2013.01); *H01L 27/10808* (2013.01); *H01L 27/10826* (2013.01); *H01L 27/10829* (2013.01)

(58) Field of Classification Search
None
See application file for complete search history.

(56) References Cited

U.S. PATENT DOCUMENTS

| 5,889,293 | A | * | 3/1999 | Rutten | ............. | H01L 21/84 |
| | | | | | | 257/211 |
| 6,627,848 | B2 | | 9/2003 | Boehnlein | | |
| 6,649,979 | B2 | | 11/2003 | Jang | | |
| 7,569,878 | B2 | | 8/2009 | Weis et al. | | |
| 8,772,109 | B2 | | 7/2014 | Colinge | | |

(Continued)

FOREIGN PATENT DOCUMENTS

| KR | 20160021726 A | 2/2016 |
| TW | 502453 B | 9/2002 |

(Continued)

*Primary Examiner* — Anthony Ho
*Assistant Examiner* — Kevin Quinto
(74) *Attorney, Agent, or Firm* — Slater Matsil, LLP

(57) ABSTRACT

An integrated circuit includes a semiconductor substrate, an isolation region extending into, and overlying a bulk portion of, the semiconductor substrate, a buried conductive track comprising a portion in the isolation region, and a transistor having a source/drain region and a gate electrode. The source/drain region or the gate electrode is connected to the buried conductive track.

20 Claims, 25 Drawing Sheets

(56) References Cited

U.S. PATENT DOCUMENTS

| | | | |
|---|---|---|---|
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,502,519 B2 | 11/2016 | Chen et al. | |
| 9,520,482 B1 | 12/2016 | Chang et al. | |
| 9,576,814 B2 | 2/2017 | Wu et al. | |
| 9,659,981 B2 | 5/2017 | Ting et al. | |
| 9,793,273 B2 | 10/2017 | Liaw | |
| 9,812,435 B2 | 11/2017 | Okagaki et al. | |
| 2005/0258492 A1* | 11/2005 | Chaudhry | G11C 16/0433 257/369 |
| 2012/0038051 A1 | 2/2012 | Halliyal et al. | |
| 2012/0126338 A1* | 5/2012 | Juengling | H01L 21/82343 257/401 |
| 2014/0264754 A1 | 9/2014 | Surthi | |
| 2015/0145041 A1* | 5/2015 | Divakaruni | H01L 27/1211 257/347 |
| 2016/0148832 A1* | 5/2016 | Leobandung | H01L 21/743 257/401 |

FOREIGN PATENT DOCUMENTS

| | | |
|---|---|---|
| TW | 200618190 A | 6/2006 |
| TW | 201344894 A | 11/2013 |
| TW | 201604941 A | 2/2016 |
| TW | 201628090 A | 8/2016 |

\* cited by examiner

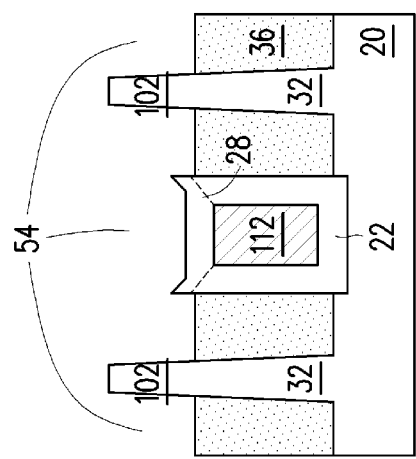
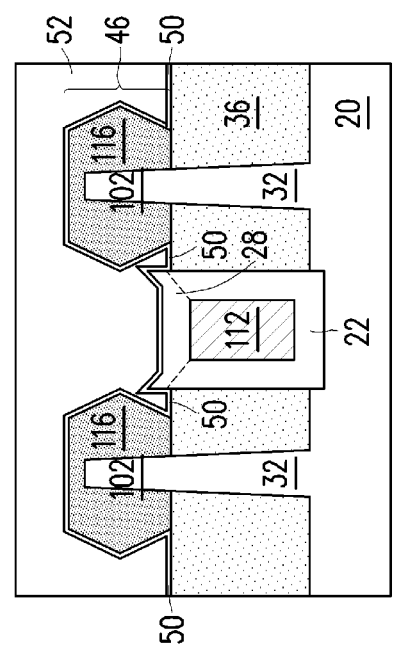
FIG. 13A
FIG. 13B

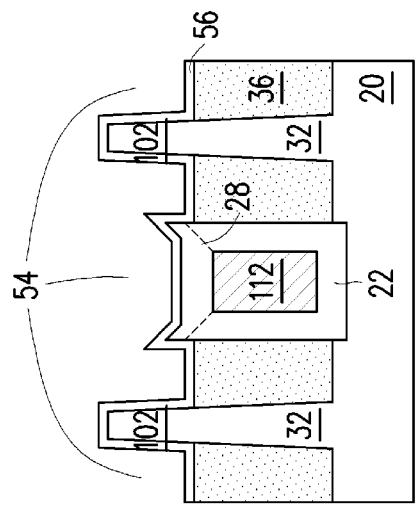
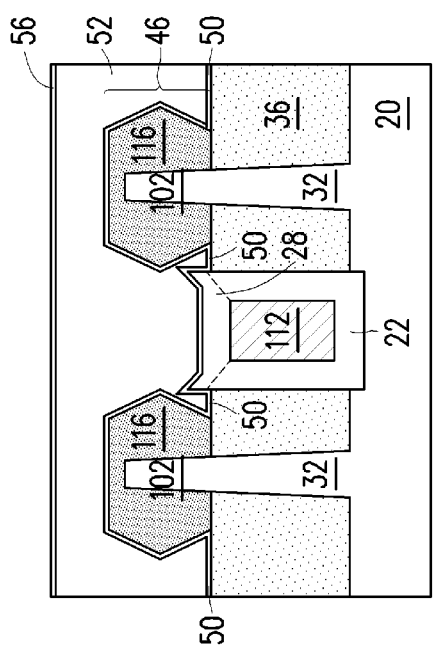
FIG. 14A
FIG. 14B

BURIED METAL TRACK AND METHODS FORMING SAME

BACKGROUND

Modern integrated circuits are made up of transistors, capacitors, and other devices that are formed on semiconductor substrates. On a substrate, these devices are initially isolated from one another but are later interconnected together to form functional circuits. Typical interconnect structures include lateral interconnections, such as metal lines (wirings), and vertical interconnects, such as vias and contacts. The quality of the interconnect structure affects the performance and the reliability of the fabricated circuit. Interconnections are increasingly determining the limits of performance and density of modern integrated circuits.

The interconnect structures may include tungsten plugs and aluminum lines. In newer generations of the integrated circuits, dual damascene structures, which include copper lines and vias formed using dual damascene processes, were also used to form the interconnect structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A through 23C illustrate the cross-sectional views of intermediate stages in the formation of a die stack in accordance with some embodiments.

DETAILED DESCRIPTION

Figure 1:
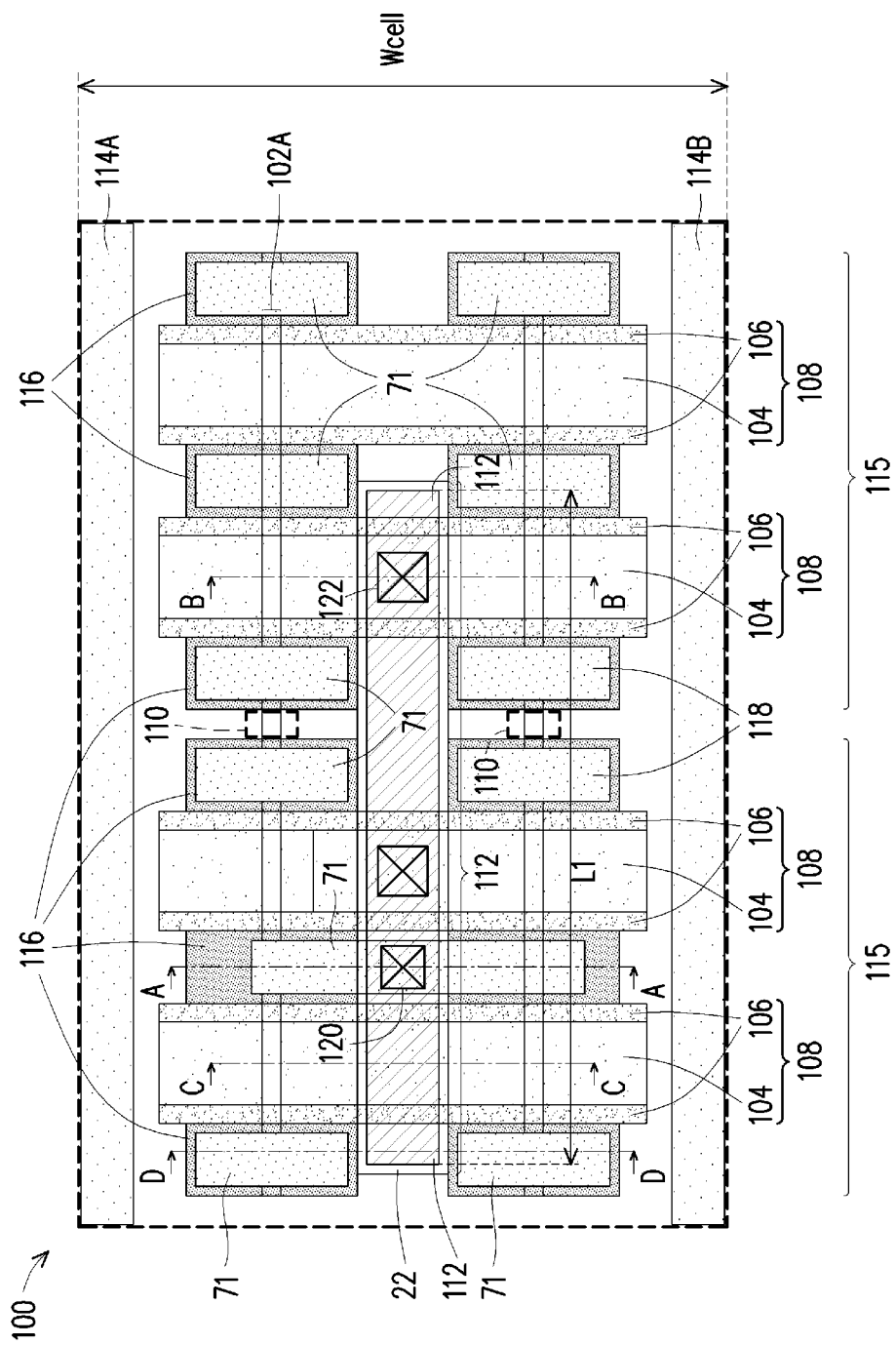
FIG. 1 illustrates a top view of a part of an integrated circuit including a buried metal track in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A buried conductive track (which may be a metal track) and the method of forming the same are provided in accordance with various exemplary embodiments. The intermediate stages of forming the buried metal track are illustrated in accordance with some embodiments. Some variations of some embodiments are discussed. Throughout the various views and illustrative embodiments, like reference numbers are used to designate like elements.

FIG. 1 illustrates a top view of a part of integrated circuit 100. In accordance with some embodiments of the present disclosure, the illustrated portion of integrated circuit 100 is a part of standard cell, which is pre-designed and saved in a database. At the time a circuit is designed, the pre-designed standard cell is copied to form a part of a larger circuit. The standard cell, as a part of the larger design, is then manufactured on a physical wafer at the time the larger circuit is manufactured. The dashed lines schematically illustrate the boundaries of the standard cell. In accordance with alternative embodiments of the present disclosure, integrated circuit 100, instead of being a standard cell and copied, is laid out at the design time.

In accordance with some embodiments of the present disclosure, integrated circuit 100 includes one or a plurality of active regions 102A and 102B, which are collectively and individually referred to as active regions 102. Active regions 102 may be semiconductor fins, or may be planar active regions. A plurality of gate structures 108 are formed over semiconductor fins 102 to form a plurality of transistors 115. When active regions 102 are semiconductor fins, the resulting transistors formed based on the semiconductor fins are Fin Field-Effect Transistors (FinFETs). The transistors may also be planar transistors when active regions are planar active regions. Throughout the description, FinFETs are discussed as examples. It is appreciated that concepts of the present disclosure, such as the metal track and its usage, can also be used along with planar transistors. Conductive track 112 may be formed between semiconductor fins 102, and may have a lengthwise direction parallel to the lengthwise directions of semiconductor fins 102. Conductive track 112 may be a metal track, and hence is alternatively referred to as metal track 112 throughout the description, while it can also be formed of other conductive material such as doped polysilicon.

Gate structures 108 include gate stacks 104 and gate spacers 106 on the opposite sides of the respective gate stacks 104. The gate stacks 104 also include gate dielectrics and gate electrodes (not shown separately), which will be discussed in subsequent paragraphs.

In accordance with some embodiments of the present disclosure, semiconductor fins 102 are long fins, with multiple gate structures 108 crossing over them to form multiple transistors. Some of the transistors may share common source regions and/or common drain regions, and the transistors are in combination used as a single transistor. For example, in the illustrated exemplary circuit, four gate structures 108 may cross-over semiconductor fin 102A to form four transistors, which may be connected in parallel (share common source/drain regions) to form one transistor. In accordance with alternative embodiments, the long fins may be cut apart into short fins, and some or all of the illustrated transistors formed based on short fins are discrete transistors. For example, when fins 102 (such as 102A and/or 102B) is cut apart at regions 110, there will be two semiconductor fins 102A and two semiconductor fins 102B, each being used for forming transistor or a plurality of transistors.

Metal track 112 may be formed between semiconductor fins 102. Integrated circuit 100 may also include metal lines 114 (including 114A and 114B), which are formed in the metal layers over the transistors. Metal track 112 and metal lines in combination perform the function for interconnecting integrated circuits. Although not shown, there may be additional metal lines at the same layers as metal lines 114A and 114B, and the additional metal lines may overlap metal track 112 in accordance with some embodiments. In accordance with some embodiments, metal track 112 has a lengthwise direction parallel to the lengthwise direction of metal lines 114A and 114B.

In accordance with some embodiments of the present disclosure, integrated circuit 100 includes epitaxy semiconductor regions 116 epitaxially grown based on semiconductor fins 102, and source/drain contact plugs 71 for connecting to the source/drain contact plugs. Conductive via 120 is used to connect one of source/drain contact plugs 71 to buried metal track 112. Conductive via 122 is used to connect the gate electrode of one of gate stacks 104 to buried metal track 112. In accordance with some embodiments in which fin 102A is cut apart in region 110, the portion of the fin 102A on the left side of region 110 will be used to form a first transistor, and the portion of the fin 102A on the right side of region 110 will be used to form a second transistor discrete from the first transistor. Accordingly, the illustrated metal track 112 is used to connect the source/drain region of the first transistor to the gate of the second transistor. In accordance with other embodiments in which fin 102A (and/or 102B) is a long fin without being cut apart, the multiple transistors formed based on the multiple gate structures 108 are connected as a single transistor, and metal track 112 performs the same function as a butted contact for interconnecting the gate and the source/drain of the transistor.

FIGS. 2A through 23C illustrate the cross-sectional views of intermediate stages in the formation of a part of an integrated circuit including a buried conductive (metal track) in accordance with some embodiments of the present disclosure. The steps shown in FIGS. 2A through 23C are also reflected schematically in the process flow shown in FIG. 24. Each of the figure numbers in FIGS. 2A through 23C may include letter "A," "B," or "C." Letter "A" indicates that the respective figure is obtained from the plane same as the vertical plane containing line A-A in FIG. 1. Letter "B" indicates that the respective figure is obtained from the plane same as the vertical plane containing line B-B in FIG. 1. Letter "C" indicates that the respective figure is obtained from the plane same as the vertical plane containing line C-C in FIG. 1. Accordingly, the figures whose numbers include letter "A" show the cross-sectional views obtained from the source/drain regions the transistors, and the figures whose numbers include letter "B" show the cross-sectional views obtained from one of gate stacks 104, which will be discussed in detail in subsequent paragraphs.

Figure 2B:
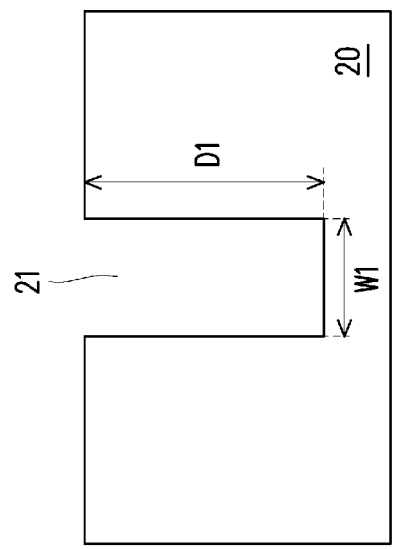
Figure 2A:
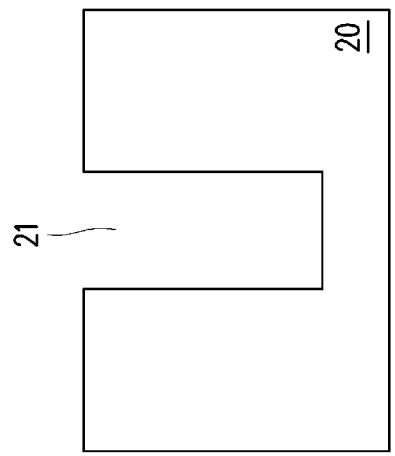

FIGS. 2A and 2B illustrate the cross-sectional views of substrate 20, which is a part of a wafer. Substrate 20 may be a semiconductor substrate such as a silicon substrate, a silicon carbon substrate, a silicon germanium substrate, a silicon-on-insulator substrate, or a substrate formed of other semiconductor materials. Substrate 20 may also be formed of other semiconductor materials such as III-V compound semiconductor materials. Substrate 20 may be lightly doped with a p-type or an n-type impurity.

Trench 21 is formed in semiconductor substrate 20 through etching. The respective step is illustrated as step 202 in the process flow shown in FIG. 24. It is appreciated that the trench 21 as shown in FIG. 2A and the trench 21 shown in FIG. 2B are different portions of the same trench, which may be an elongated trench with a substantially uniform width. For example, the top-view shape of trench 21 is the same as the top-view shape of the region occupied by metal track 112 and dielectric 22 in combination, as shown in FIG. 1.

Referring back to FIGS. 2A and 2B, in accordance with some embodiments, depth D1 of trench 21 may be in the range between about 60 nm and about 80 nm. Width W1 of trench 21 may be in the range between about 20 nm and about 50 nm. It is appreciated that the values recited throughout the description are examples, and different values may be used. The length of trench 21, which is close to the length L1 of buried metal track 112, which is shown in FIG. 1, may be greater than about 10 μm, and may be in the range between about 500 nm and about 10 μm.

Figure 3A:
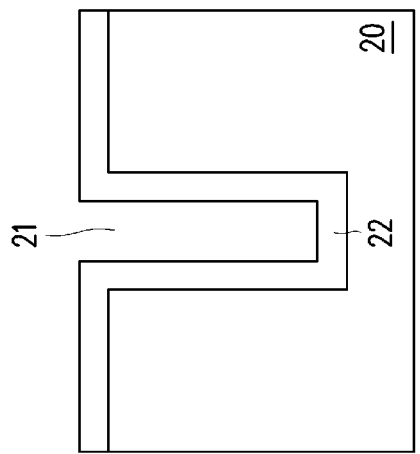
Figure 3B:
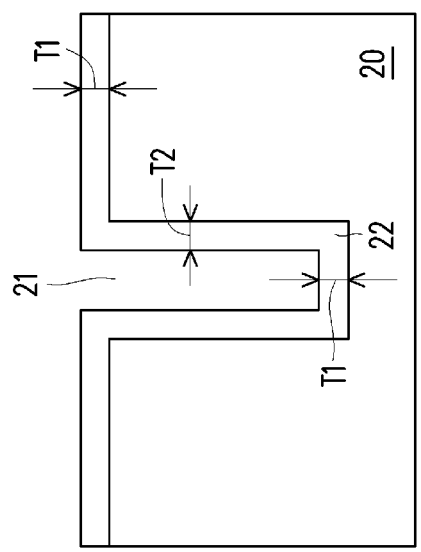

Next, dielectric layer 22 is formed to extend into trench 21, as shown in FIGS. 3A and 3B. The respective step is illustrated as step 204 in the process flow shown in FIG. 24. Dielectric layer 22 may be formed of silicon nitride, silicon oxide, silicon oxynitride, silicon carbide, silicon carbonitride, or the like. In accordance with some embodiments, dielectric layer 22 is formed through deposition, and the formation method may include Atomic Layer Deposition (ALD), Chemical Vapor Deposition (CVD), Low-Pressure Chemical Vapor Deposition (LPCVD), or the like. In accordance with alternative embodiments, dielectric layer 22 is formed by reacting a surface layer of substrate 20 to generate dielectric layer 22. When formed through reaction, the surface layer of substrate 20 may be oxidized and/or nitridated to form silicon oxide, silicon nitride, or silicon oxynitride. Dielectric layer 22 may be a conformal layer whose horizontal portions and the vertical portions have thicknesses close to each other. For example, the thickness T1 (FIG. 3A) of the horizontal portions and the thickness T2 of the vertical portions may have a difference smaller than about 20 percent of both thicknesses T1 and T2. Thicknesses T1 and T2 may be in the range between about 3 nm and about 10 nm.

Figure 4A:
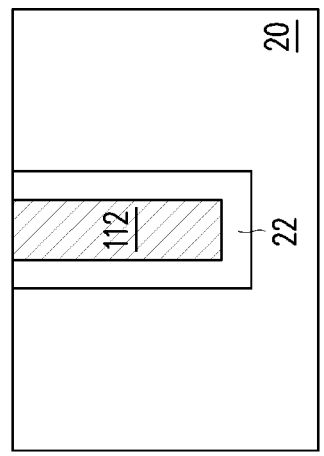
Figure 4B:
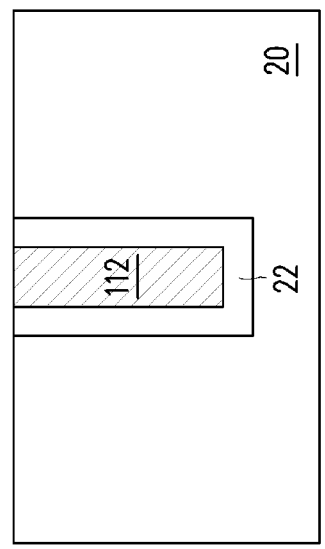

Trench 21 is then filled with a conductive material, which may be a metal-containing material, to form conductive track 112, which is shown in FIGS. 4A and 4B. The respective step is illustrated as step 206 in the process flow shown in FIG. 24. Throughout the description, conductive track 112 is alternatively referred to as metal track 112. In accordance with some embodiments, the filling of the conductive material is achieved by depositing a seed layer through Physical Vapor Deposition (PVD), and then performing a plating process to deposit a metallic material on the seed layer. The conductive material may also be filled through CVD. In accordance with some embodiments of the present disclosure, the conductive material is formed of a metal selected from Cu, Co, W, Ru, Al, Ni, or alloys thereof. In accordance with other embodiments of the present disclosure, the conductive material is formed of a metal compound such as AlCu, W—TiN, TiSi, NiSi, TiN, TaN, or the like. In accordance with other embodiments of the present disclosure, the conductive material includes polysilicon, which may be doped with a p-type dopant such as boron or an n-type dopant such as phosphorous or arsenic. After the filling of the conductive material, a planarization step such as Chemical Mechanical Polish (CMP) or mechanical grinding is performed to remove the portions of dielectric layer 22 and the conductive material over the top surface of substrate 20.

Figure 5B:
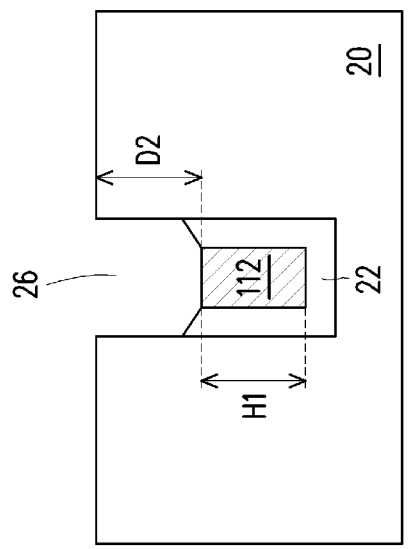
Figure 5A:
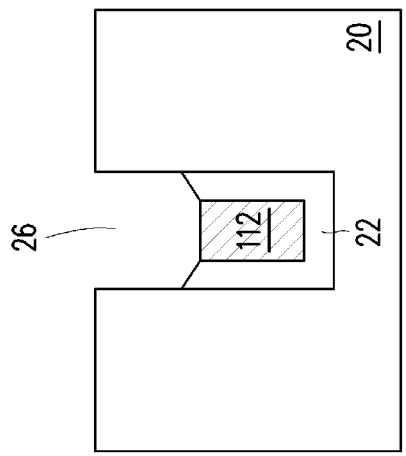

FIGS. 5A and 5B illustrate the recessing of dielectric layer 22 and metal track 112 to form recess 26. The respective step is illustrated as step 208 in the process flow shown in FIG. 24. The recessing may be performed through wet etching or dry etching. The recessing depth D2 may be in the range between about 30 nm and about 50 nm. The remaining metal track may have height H1 between about 20 nm and about 40 nm. In accordance with some embodiments, the top surfaces of dielectric layer 22 are slanted, with the outer portions of the top surfaces closer to substrate 20 being increasingly higher than the respective inner portions of the top surfaces closer to metal track 112. This may be achieved by controlling the etching process conditions such as the process gas flow ratio, partial pressure, temperature, and the like.

Figure 6A:
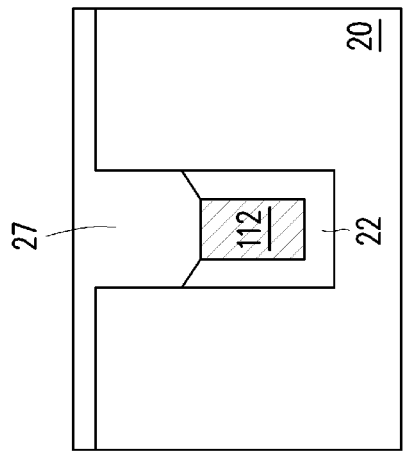
Figure 6B:
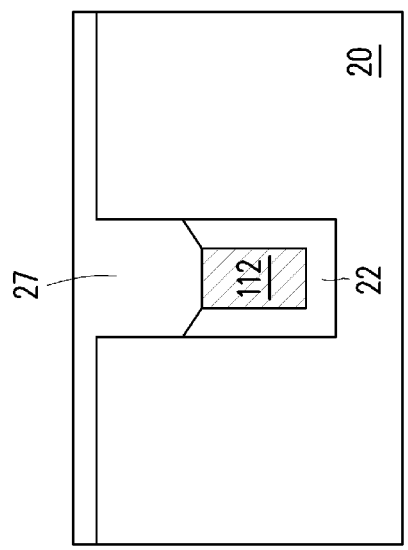

FIGS. 6A and 6B and FIGS. 7A and 7B illustrate the formation of dielectric cap 28 for covering metal track 112. The respective step is illustrated as step 210 in the process flow shown in FIG. 24. Referring to FIGS. 6A and 6B, dielectric material 27 is deposited. Dielectric material 27 may be formed of a dielectric material selected from the same group of candidate materials for forming dielectric layer 22. Furthermore, dielectric material 27 and dielectric layer 22 may be formed of the same dielectric material or different dielectric materials. Dielectric layer 27 may fully fill recess 26 (FIGS. 5A and 5B), or partially fill recess 26. Dielectric layer may be planarized.

Figure 7A:
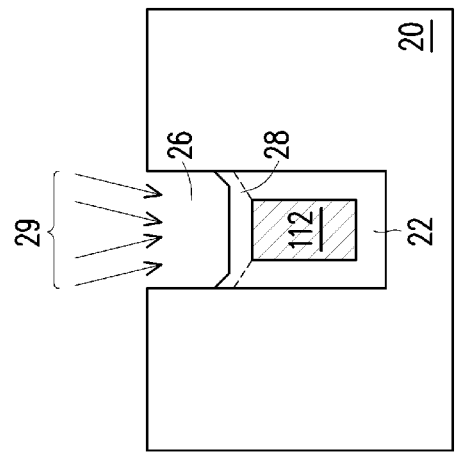
Figure 7B:
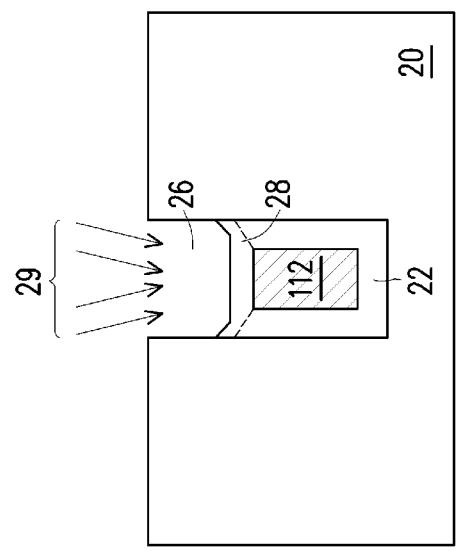

Dielectric material 27 is then etched back, and the remaining portion of dielectric material 27 is referred to as dielectric cap 28, as is shown in FIGS. 7A and 7B. Dielectric cap 28 and dielectric layer 22 may or may not have a distinguishable interface there between. Accordingly, the interface between dielectric cap 28 and dielectric layer 22 is illustrated using dashed lines to indicate it may or may not exist. In accordance with some embodiments, the etch-back includes two tilted dry etching processes to help the formation of slanted top surface. The tilted etchings are shown by arrows 29. In each of the tilted etchings, bias voltages are applied to make the ions formed from the etching gases to move in a direction tilted relative to the major top surface of the respective wafer.

In the cross-sectional views shown in FIGS. 7A and 7B, metal track 112 is enclosed by, and buried in, dielectric materials including dielectric layer 22 and dielectric cap 28. Metal track 112 is thus referred to as buried metal track 112 throughout the description.

Figure 8A:
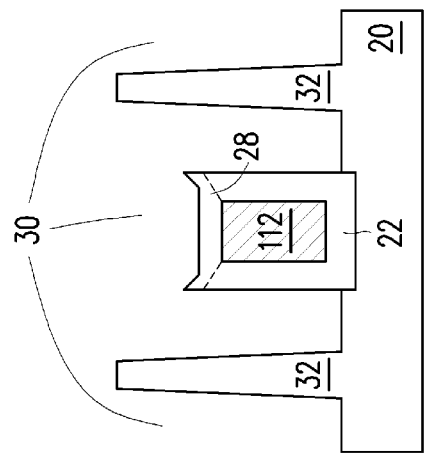
Figure 8B:
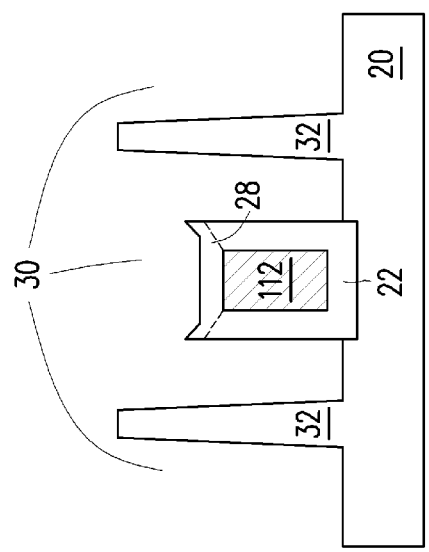

FIGS. 8A, 8B, 9A, and 9B illustrate the formation of isolation regions and semiconductor fins. The respective step is illustrated as step 212 in the process flow shown in FIG. 24. Referring to FIGS. 8A and 8B, substrate 20 is etched to form trenches 30. The remaining structure includes semiconductor strips 32, which are the strip portions of the remaining substrate 20. Semiconductor strips 32 are over a bulk portion of substrate 20. In the etching, dielectric cap 28 and dielectric layer 22 are not etched, and hence some portions of dielectric layer 22 are higher than the top surface of the bulk portion of substrate 20. A bottom portion of dielectric layer 22 may extend into substrate 20. The bottom surface of buried metal track 112 may be higher than, level with, or lower than, the top surface of the bulk portion of substrate 20.

Figure 9A:
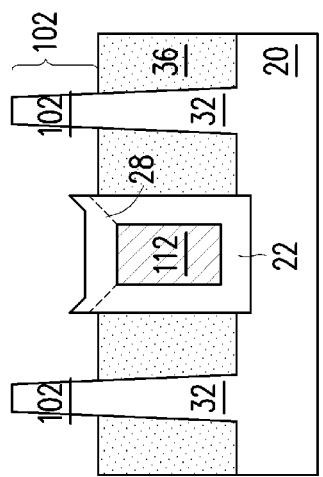
Figure 9B:
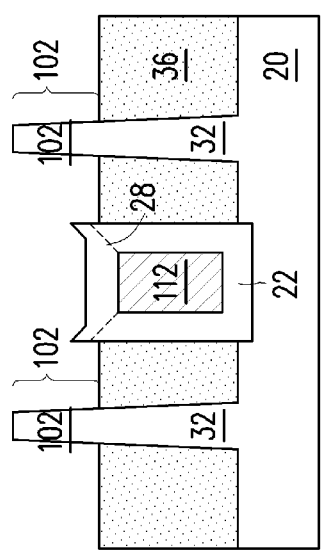

In a subsequent step, as shown in FIGS. 9A and 9B, dielectric region/material 36 is formed to fill trenches 30 as shown in FIGS. 8A and 8B. The illustrated dielectric regions are also referred to as isolation regions 36 or Shallow Trench Isolation (STI) regions 36. In accordance with some embodiments of the present disclosure, STI regions 36 include liner oxide (not shown separately) and a filling dielectric material (not shown separately) over the liner oxide. The liner oxide may be formed as a conformal layer, whose horizontal portions and vertical portions have thicknesses close to each other. In accordance with some embodiments of the present disclosure, the liner oxide is formed by oxidizing the exposed surface layer of substrate 20 and semiconductor strips 32 in an oxygen-containing environment, for example, through Local Oxidation of Silicon (LOCOS), wherein oxygen ($O_2$) may be included in the respective process gas. The filling dielectric material is formed to fill the remaining portions of trenches 30. The filling dielectric material may be formed of silicon oxide, silicon carbide, silicon nitride, or multi-layers thereof. The formation method of the filling dielectric material may be selected from Flowable Chemical Vapor Deposition (FCVD), spin-on coating, CVD, ALD, High-Density Plasma Chemical Vapor Deposition (HDPCVD), and LPCVD. After the deposition of the filling dielectric material, a planarization step is performed to remove excess portions of the liner oxide and the filling dielectric material. As a result, STI regions 36 may have top surfaces slightly higher than the top surfaces of semiconductor strips 32. A recessing step is then performed to remove the portions of STI regions covering dielectric cap 28, and the resulting structure is shown in FIGS. 9A and 9B.

In the resulting structure, as shown in FIGS. 9A and 9B, the top portions of semiconductor strips 32 are higher than the top surfaces of STI regions 36, and are referred to as semiconductor fins 102 (also shown in FIG. 1). Dielectric cap 28 may have tips at the top end of the slanted top surfaces, and the top tips may also protrude higher than the top surfaces of STI regions 36.

Figure 10B:
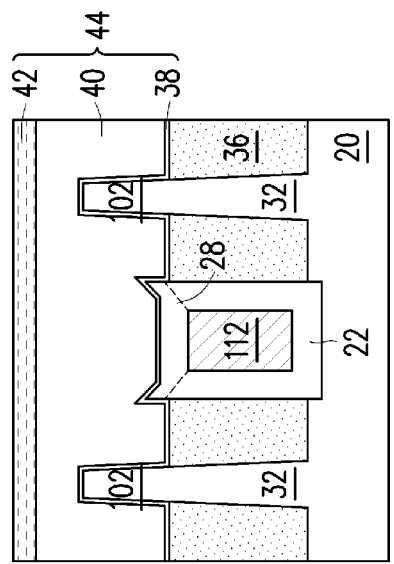
Figure 10A:
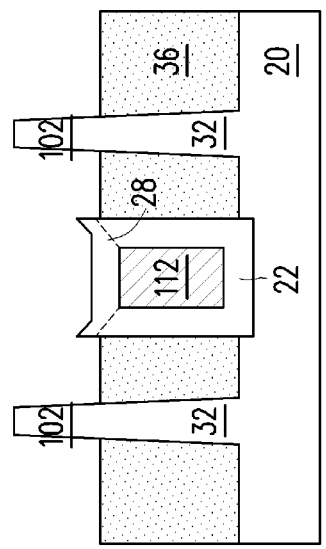

Next, dummy gate stacks are formed, wherein FIG. 10B illustrates one of dummy gate stacks 44. The respective step is illustrated as step 214 in the process flow shown in FIG. 24. In accordance with some embodiments of the present disclosure, each dummy gate stack 44 includes dummy gate dielectric 38, dummy gate electrode 40, and hard mask 42. Dummy gate dielectric 38 may be formed of silicon oxide, dummy gate electrode 40 may be formed of polysilicon, and hard mask 42 may be formed of silicon nitride in accordance with some embodiments of the present disclosure. The formation of the dummy gate dielectric 38, dummy gate electrode 40, and hard mask 42 may include depositing these layers as blanket layers, and patterning the blanket layers in an etching step. The resulting dummy gate stacks 44 are at the same locations as, and have the same shapes and sizes as, gate stacks 104 as shown in FIG. 1. Dummy gate stacks 44 cross over semiconductor fins 102, as shown in FIG. 10B (also refer to FIG. 1). After the formation of dummy gate stacks 44, gate spacers 106 (which are shown in FIG. 1) are formed on the sidewalls of dummy gate stacks 44. Since the cross-sectional views shown in FIGS. 10A and 10B are obtained from the vertical plane containing lines A-A and B-B, respectively, in FIG. 1, dummy gate stack 44 is shown in FIG. 10B, and is not present in the cross-sectional view shown in FIG. 10A.

Figure 11B:
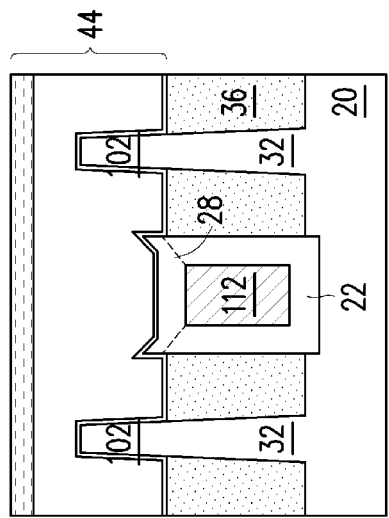
Figure 11A:
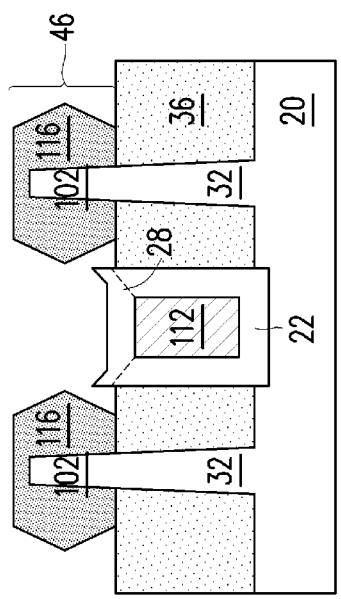

FIG. 11A illustrates the formation of epitaxy semiconductor regions 116 (also refer to FIG. 1), which are selectively grown on semiconductor fins 102 in accordance with some embodiments. The respective step is illustrated as step 216 in the process flow shown in FIG. 24. Since the growth is selective, semiconductor regions 116 are not grown on Dummy gate stack 44 as shown in FIG. 11B. In accordance with some exemplary embodiments, semiconductor regions 116 include silicon germanium or silicon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB) may be grown. Conversely, when the resulting FinFET is an n-type FinFET, silicon phosphorous (SiP) or silicon carbon phosphorous (SiCP) may be grown. In accordance with alternative embodiments of the present disclosure, semiconductor regions 116 are formed of a III-V compound semiconductor such as GaAs, InP, GaN, InGaAs, InAlAs, GaSb, AlSb, AlAs, AlP, GaP, combinations thereof, or multi-layers thereof.

After the epitaxy step, semiconductor regions 116 and fins 102 may be further implanted with a p-type or an n-type impurity to increase their impurity concentration. In accordance with alternative embodiments of the present disclosure, the implantation step is skipped when semiconductor regions 116 are in-situ doped with the p-type or n-type impurity during the epitaxy. Source/drain regions 46, which include epitaxy semiconductor regions 116 and fins 102, are thus formed.

In accordance with alternative embodiments, instead of growing semiconductor regions 116 directly from fins 102, an etching step (referred to as source/drain recessing hereinafter) is performed to etch fins 102. Semiconductor regions 116 are grown from the recesses.

As shown in FIG. 11A, semiconductor regions 116 are grown both laterally and vertically. The tips of dielectric cap 28 may hamper the neighboring semiconductor regions 116 from over-growing if the over-growth happens, and may help leave enough space for forming via 120, as is shown in FIG. 23A.

Figure 12B:
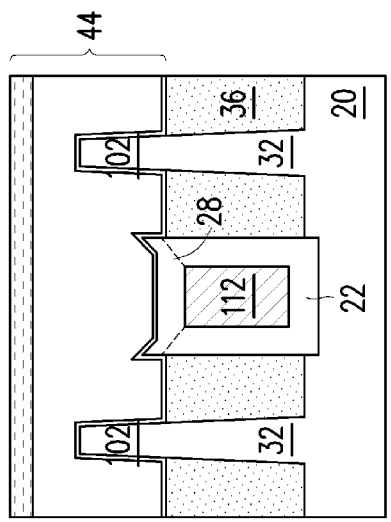
Figure 12A:
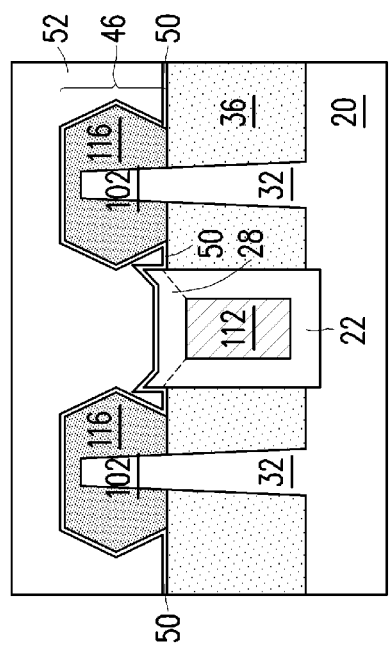

Referring to FIG. 12A, Contact Etch Stop Layer (CESL) 50 and Inter-Layer Dielectric (ILD) 52 are formed. The respective step is also illustrated as step 216 in the process flow shown in FIG. 24. In accordance with some embodiments of the present disclosure, a buffer oxide layer (not shown) may also be formed on source and drain regions 46 before the formation of CESL 50. The buffer oxide layer may be formed of silicon oxide, and CESL 50 may be formed of silicon nitride, silicon carbo-nitride, or the like. The buffer oxide layer and CESL 50 may be formed using a conformal deposition method such as ALD, for example. ILD 52 may include a dielectric material formed using, for example, FCVD, spin-on coating, CVD, or another applicable deposition method. ILD 52 may be formed of Tetra Ethyl Ortho Silicate (TEOS) oxide, PECVD oxide (SiO$_2$), Phospho-Silicate Glass (PSG), Boro-Silicate Glass (BSG), Boron-Doped Phospho-Silicate Glass (BPSG), or the like. A planarization step such as CMP or mechanical grinding may be performed to level the top surfaces of ILD 52 (FIG. 12A), dummy gate stacks 44 (FIG. 12B), and gate spacers 106 (FIG. 1) with each other.

Dummy gate stack 44 as shown in FIG. 12B is then removed. As a result, recess 54 (FIG. 13B) is formed. The respective step is illustrated as step 218 in the process flow shown in FIG. 24. Referring to FIG. 1, the recesses 54 (not shown) will be at the same locations the gate stacks 104 are shown. In the meantime, the ILD 52 (FIG. 13A) and gate spacers 106 (FIG. 1) will remain, and will encircle recesses 54. As shown in FIG. 13B, portions of semiconductor fins 102 are revealed, and are exposed to recess 54. Dielectric cap 28 may also be revealed.

Next, as shown in FIGS. 14A and 14B, (replacement) gate dielectric layer 56 is formed, which extend into recess 54 (FIG. 14B), and may have a portion extending over ILD 52 as shown in FIG. 14A. The respective step is illustrated as step 220 in the process flow shown in FIG. 24. In accordance with some embodiments of the present disclosure, gate dielectric layer 56 includes an Interfacial Layer (IL, not shown separately) as its lower part. The IL is formed on the exposed surfaces of semiconductor fins 102, and may or may not extend on STI regions 36 and dielectric cap 28. The IL may include an oxide layer such as a silicon oxide layer, which is formed through the thermal oxidation of semiconductor fins 102, a chemical oxidation process, or a deposition process. Gate dielectric layer 56 may also include a high-k dielectric layer formed over the IL. The high-k dielectric layer is formed as a conformal layer, and includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0. In accordance with some embodiments of the present disclosure, the high-k dielectric layer in gate dielectric layer 56 is formed using ALD or CVD.

Figure 15A:
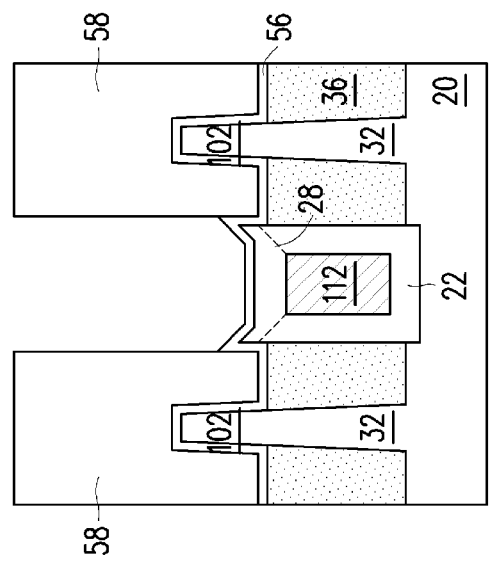
Figure 15B:
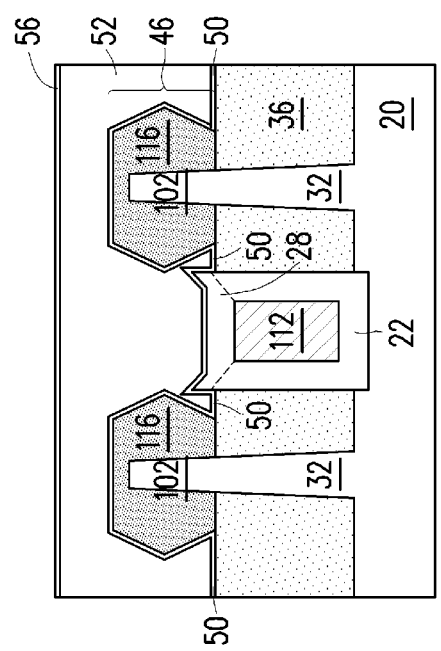

FIGS. 15A, 15B, 16A, and 16B illustrate the exposure of buried metal track 112. The respective step is also illustrated as step 220 in the process flow shown in FIG. 24. FIG. 15B illustrates the formation of etching mask 58, which may be a photo resist. Etching mask 58 is patterned to reveal the portion of gate dielectric layer 56 directly over buried metal track 112, while covering the portions of gate dielectric layer 56 overlying fins 102 in FIG. 15B. The portions of gate dielectric layer 56 as shown in FIG. 15A are also exposed.

Figure 16A:
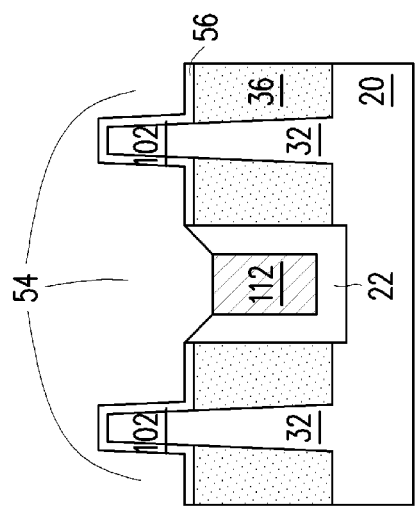

Next, the exposed portions of gate dielectric layer 56 are etched. Furthermore, dielectric cap 28 is also etched, and buried metal track 112 is exposed. After the etching of gate dielectric layer 56, etching mask 58 is removed, and the resulting structure is shown in FIGS. 16A and 16B.

Figure 16B:
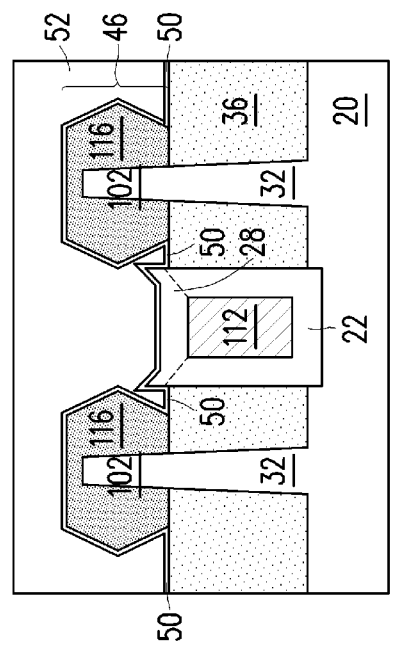
Figure 17A:
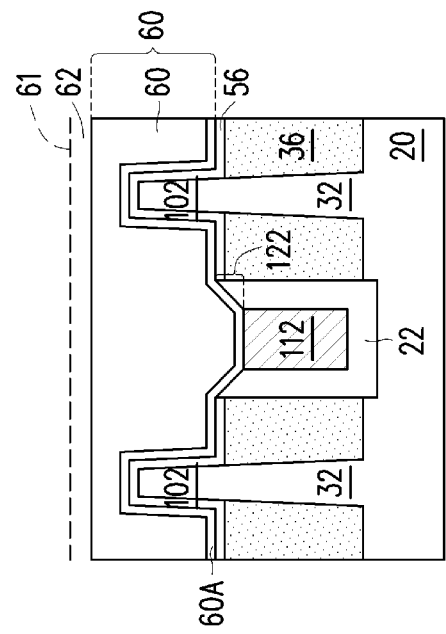
Figure 17B:
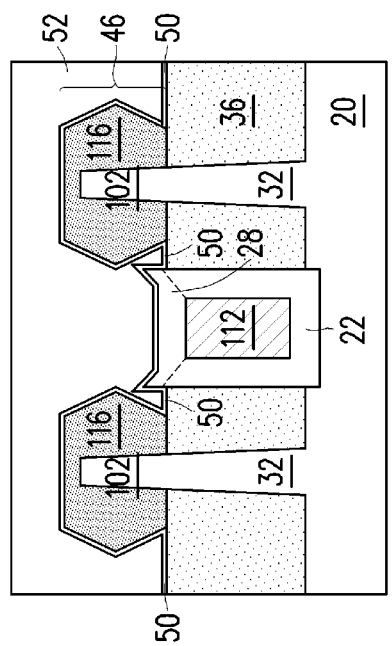

In a subsequent step, as shown in FIG. 17B, gate electrode 60 is formed over gate dielectric layer 56 and filling the trench 54 as shown in FIG. 16B. The respective step is illustrated as step 222 in the process flow shown in FIG. 24. The formation of gate electrode 60 may include a plurality of deposition processes to deposit a plurality of conductive layers, and performing a planarization step to remove the excess portions of the conductive layers over ILD 52 (FIG. 17A). The resulting gate electrode 60 thus will have a top surface at the level shown with dashed line 61. The deposition of the conductive layers may be performed using conformal deposition methods such as ALD or CVD.

Gate electrode 60 may include diffusion barrier layer 60A and one (or more) work-function layer over the diffusion barrier layer. The diffusion barrier layer 60A may be formed of titanium nitride (TiN), which may (or may not) be doped with silicon to form TiSiN. The work-function layer determines the work function of the gate, and includes at least one layer, or a plurality of layers formed of different materials. The specific material of the work-function layer is selected according to whether the respective FinFET is an n-type FinFET or a p-type FinFET. For example, when the FinFET is an n-type FinFET, the work-function layer may include a TaN layer and a titanium aluminum (TiAl) layer over the TaN layer. When the FinFET is a p-type FinFET, the work-function layer may include a TaN layer, a TiN layer over the TaN layer, and a TiAl layer over the TiN layer. After the deposition of the work-function layer(s), another barrier layer, which may be another TiN layer, is formed. Gate electrode 60 may also include a filling metal, which may be formed of tungsten or cobalt, for example. The filling metal fully fills remaining recess 54 (FIG. 16B).

As shown in FIG. 17B, a portion of the conductive material forms via 122, which is underlying gate electrode 60, and connects gate electrode 60 to buried metal track 112. Via 122 is also shown in FIG. 1. Buried metal track 112 and via 122 have the similar functions as the metal lines and vias in the interconnect structures that are formed over transistors. Next, gate electrode 60 is etched to form recess 62, as shown in FIG. 17B.

Figure 18B:
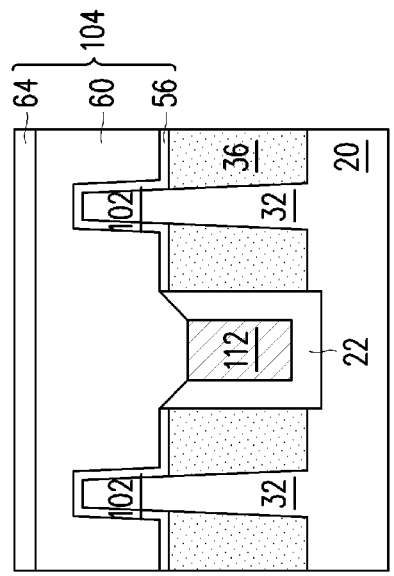
Figure 18A:
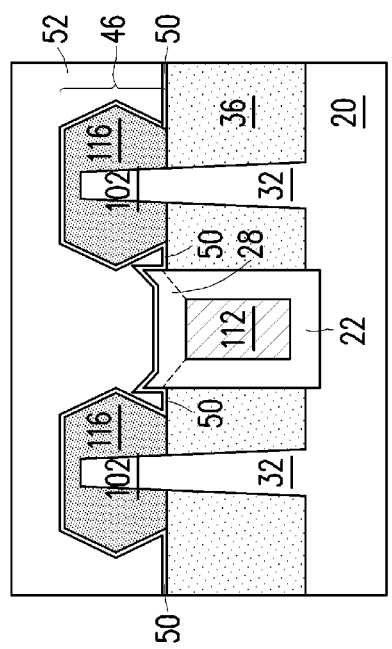

Referring to FIG. 18B, hard mask 64 is formed over gate electrode 104. Hard mask 64 fills the recess 62 as shown in FIG. 17B. Hard mask 64 is formed of a dielectric material, which may be silicon oxide, silicon nitride, aluminum oxide, silicon carbide, etc. Gate dielectric layer 56, gate electrode 60, and hard mask 64 are in combination referred to as gate stack 104, which is also illustrated in FIG. 1. As also shown in FIG. 1, gate stacks 104 form a plurality of strips parallel to each other, and the lengthwise directions of gate stacks 104 may be perpendicular to the lengthwise direction of buried metal track 112.

Figure 19B:
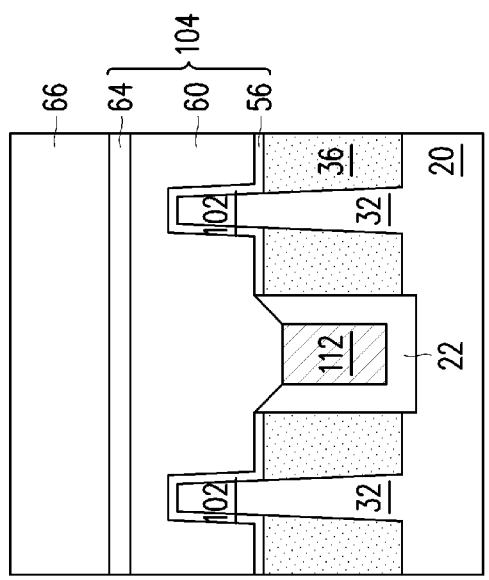
Figure 19A:
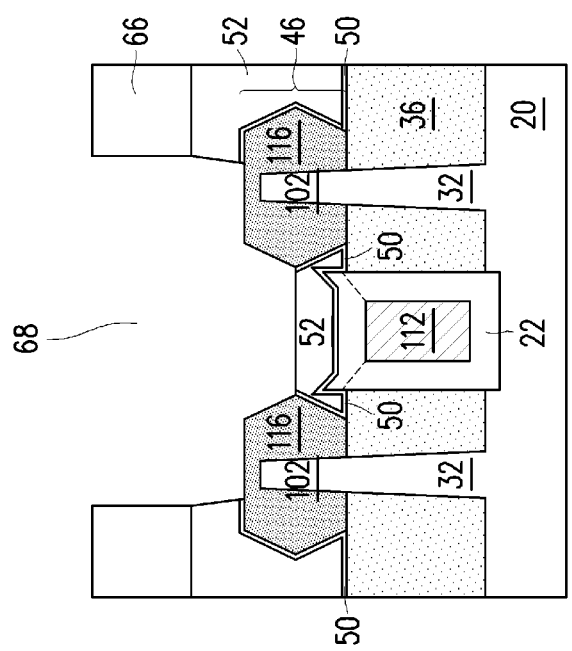

FIGS. 19A through 22B illustrate the formation of source/drain contact plugs. Referring to FIG. 19A, photo resist 66 is formed and patterned. Photo resist 66 covers gate stack 104, as shown in FIG. 19B. The patterned photo resist 66 is then used as an etching mask to etch ILD 52, so that opening 68 is formed to extend into ILD 52. The respective step is illustrated as step 224 in the process flow shown in FIG. 24. The etchant is selected, so that semiconductor regions 116 are not etched, and may be used as etch stop layers in some regions. After the etching of ILD 52, photo resist 66 is removed.

Figure 20B:
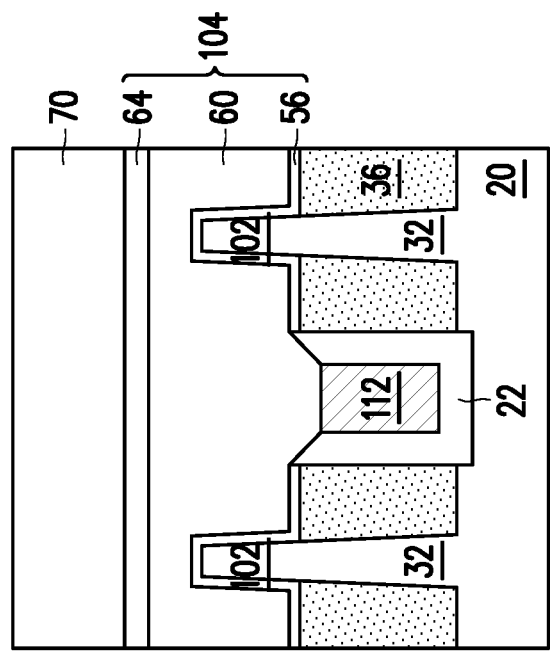
Figure 20A:
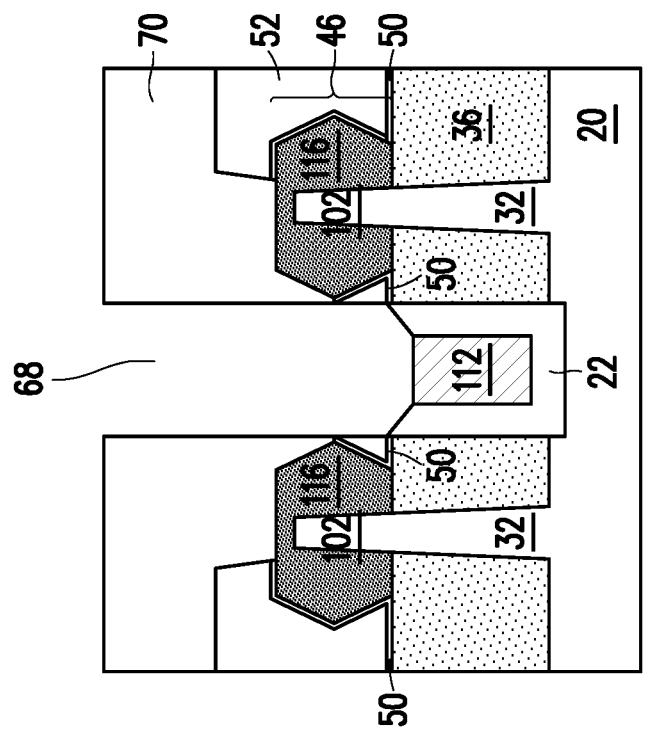

Next, referring to FIGS. 20A and 20B, photo resist 70 is formed and patterned, hence covering gate stack 104, and leaves a portion of ILD 52 exposed. The ILD 52 is further etched, so that opening 68 further extends down into ILD 52, until dielectric cap 28 (FIG. 19A) is exposed. The exposed dielectric cap 28 is then etched, and buried metal track 112 is exposed. After the etching, photo resist 70 is removed.

Figure 21B:
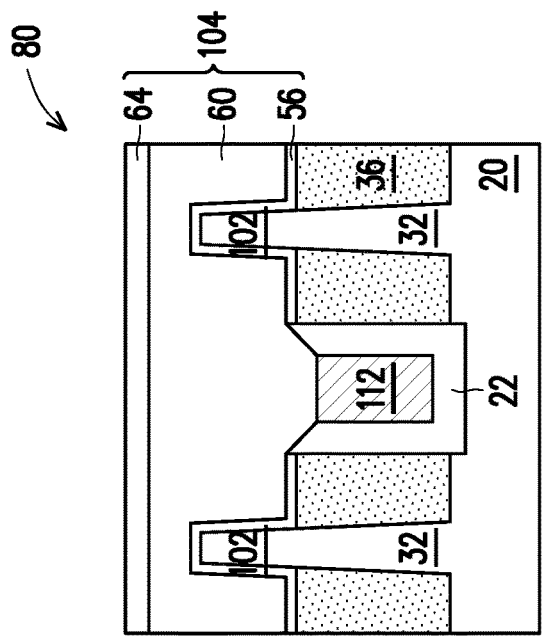
Figure 21A:
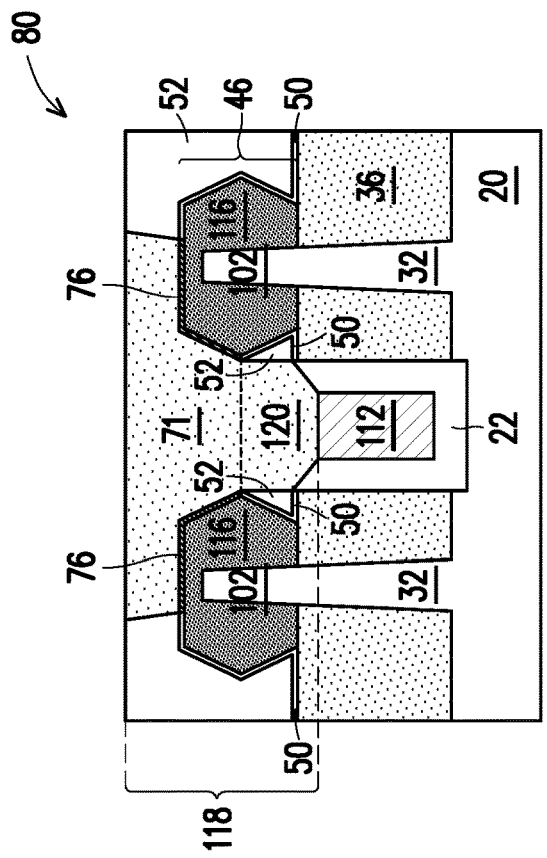

FIG. 21A illustrates the formation of conductive feature 118. The respective step is illustrated as step 226 in the process flow shown in FIG. 24. Furthermore, source/drain silicide regions 76 are formed on the surfaces of semiconductor regions 116. In accordance with some embodiments, the formation of conductive feature 118 includes forming a metal layer and a metal nitride layer (not shown separately) extending into opening 68 (FIG. 20A). The metal layer may be formed of titanium, and the metal nitride layer may be formed of titanium nitride. The metal layer and the metal nitride layer may be conformal layers extending onto the sidewalls and upward-facing and downward-facing facets of source/drain regions 46. Next, an anneal is performed, and source/drain silicide regions 76 are formed on the surfaces of source/drain regions 46. A metallic material is then deposited to fill the remaining opening 68, followed by a planarization step. Conductive feature 118 is thus formed in ILD 52. Conductive feature 118 includes source/drain contact plug 71 and via 120, which are formed simultaneously. FinFETs 80 are thus formed, with each of the FinFETs 80 include source/drain regions 46 (FIG. 21A), and fins 102 and gate stack 104 over fins 102 (FIG. 21B, also refer to FIG. 1).

As shown in FIGS. 1 and 21A, source/drain contact plug 71 is electrically connected to buried metal track through via 120. Accordingly, as shown in FIGS. 21A and 21B, buried metal track 112 is able to connect to both the gate electrodes and source/drain contact plugs (and hence source/drain regions), and may be used as a part of an interconnect structure.

Figure 22:
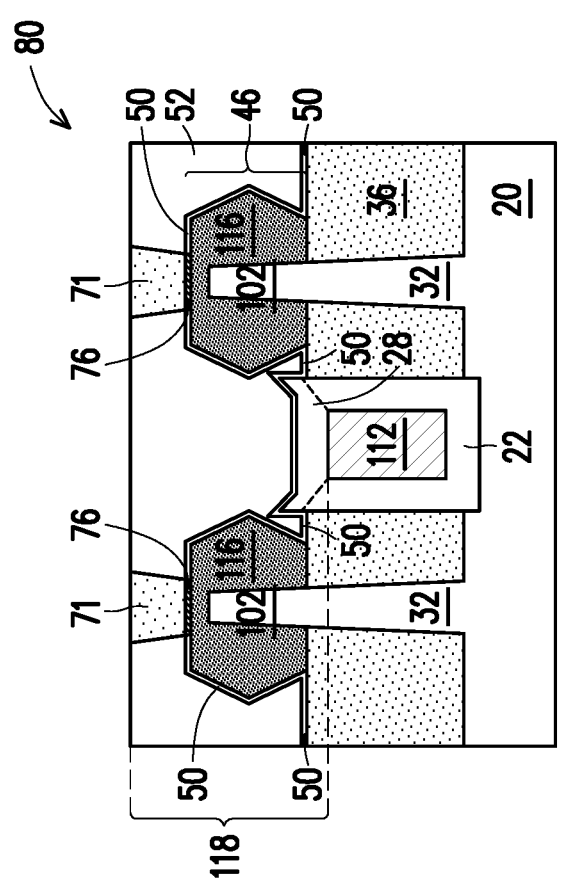

FIG. 22 illustrates a cross-sectional view of source/drain contact plugs 71 formed in accordance with some embodiments. The illustrated source/drain contact plugs 71 are not connected to buried metal track 112. The cross-sectional view shown in FIG. 22 may also be obtained from the vertical plane containing line D-D as shown in FIG. 1.

Figure 23B:
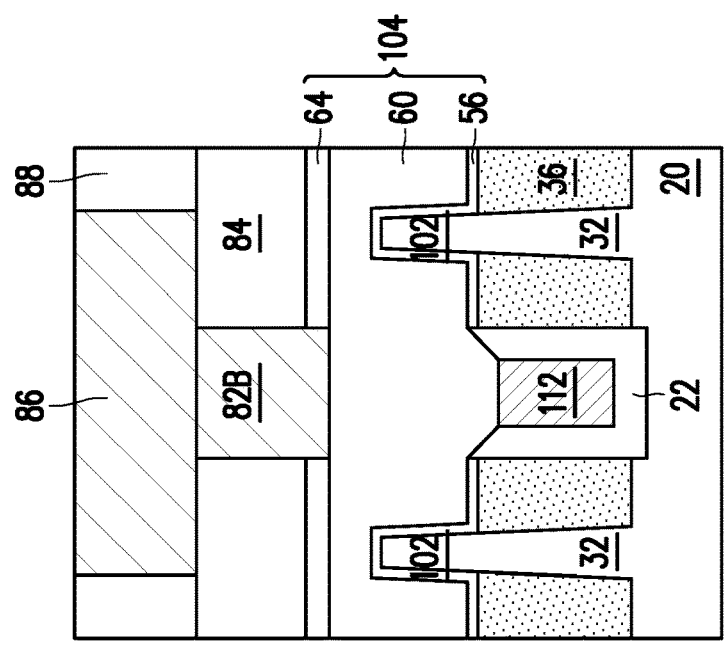
Figure 23A:
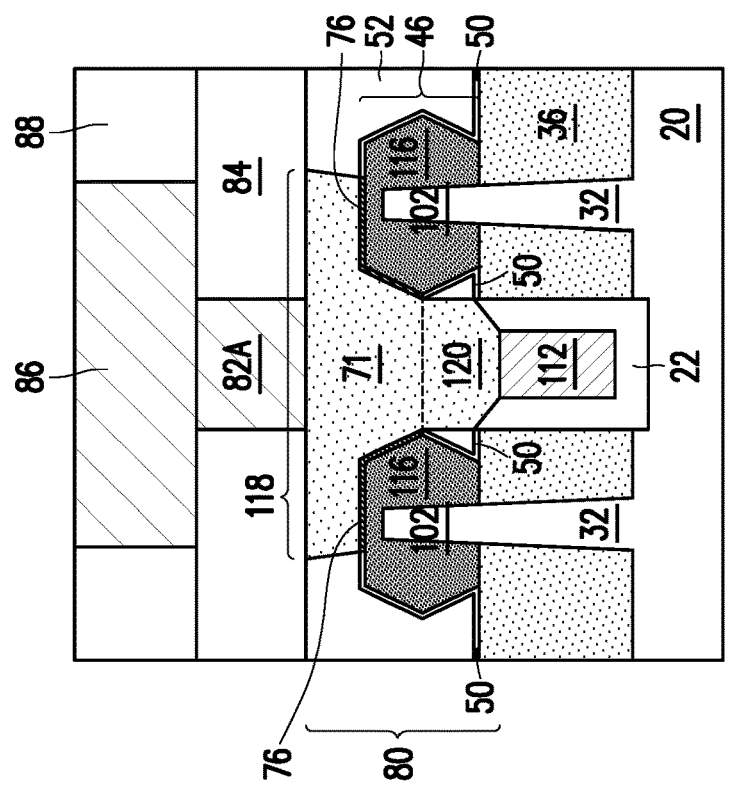
Figure 24:
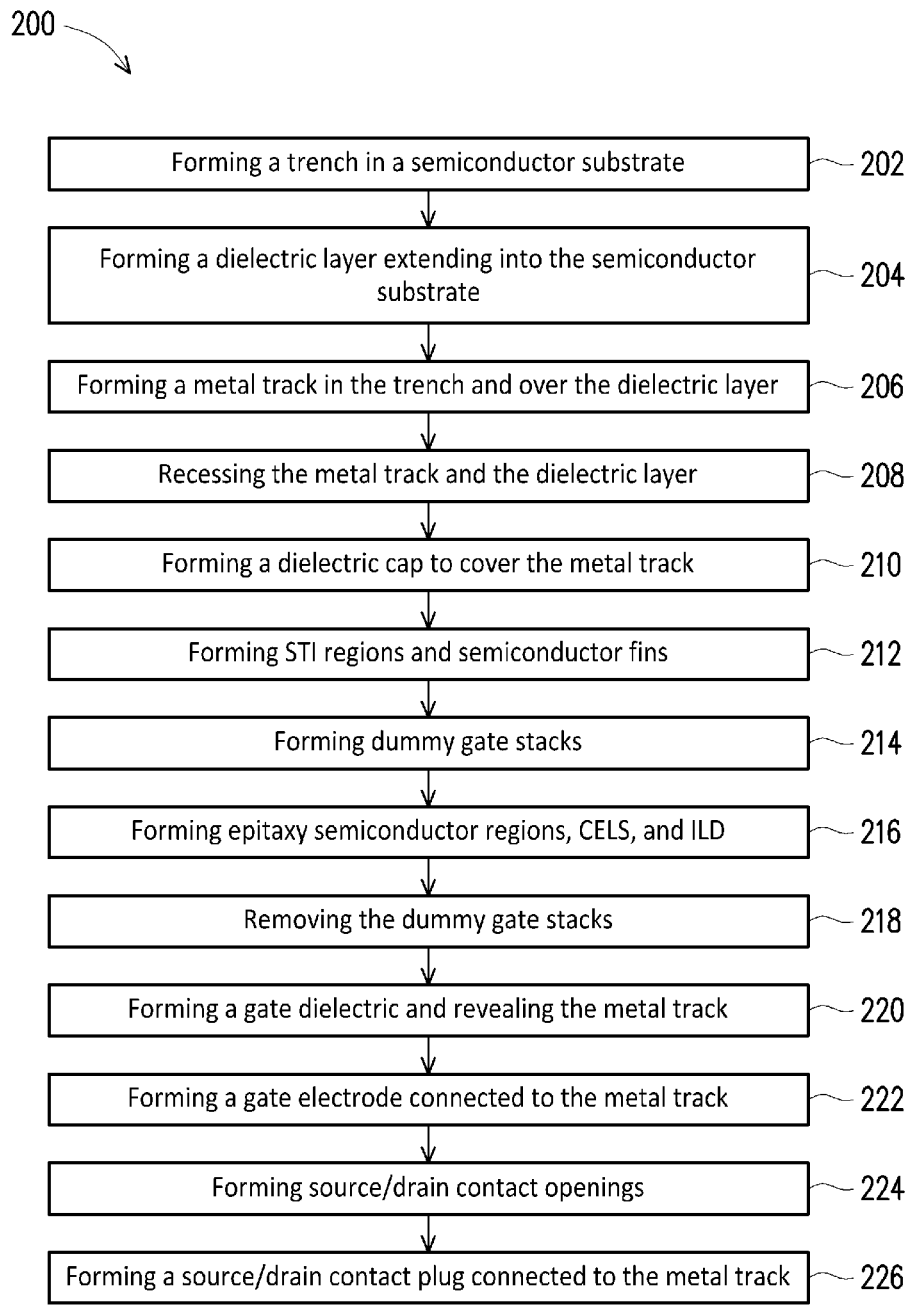
FIG. 24 illustrates a process flow for forming an integrated circuit including a buried metal track in accordance with some embodiments.

FIGS. 23A and 23B illustrate the formation of dielectric layer 84, which may also be referred to as an ILD, and contact plugs 82A and 82B in ILD 84. Contact plugs 82A and 82B are connected to source/drain contact plug 71 and gate electrode 60, respectively. Inter-Metal Dielectric (IMD) 88 and metal lines 86 are then formed, with metal lines 86 connected to contact plugs 82A and 82B. IMD 88 may be formed of a low-k dielectric layer, for example.

Figure 23C:
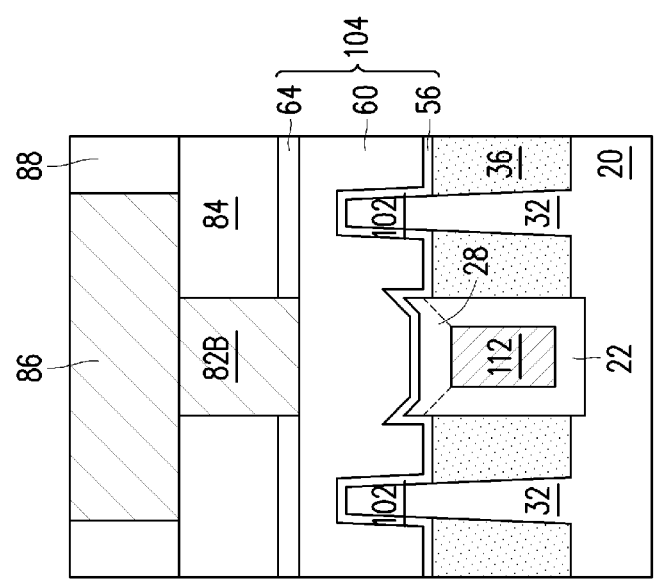

FIG. 23C illustrates a cross-sectional view obtained from the vertical line containing line C-C in FIG. 1. In accordance with some embodiments, the respective gate electrode 60, as shown in FIG. 23C, is not connected to buried metal track 112. Rather, gate electric 56 and dielectric cap 28 are used to electrically insulate the corresponding gate electrode 60 from buried metal track 112.

The embodiments of the present disclosure have some advantageous features. In the layout of integrated circuits such as standard cells, the required number of metal lines becomes a bottle neck for reducing the size (particular the width (such as width Wcell in FIG. 1)) of integrated circuits. By burying some of the metal lines into STI regions rather than forming all metal lines in metal layers, more metal lines can be formed, and the width Wcell of the standard cells, which may be limited by the width required to allocate the required number of metal lines, can be reduced. For example, the width Wcell of standard cells may be reduced by between about 10 percent and about 50 percent. The gate density of transistors can also be increased since transistors may be laid out more compactly without being limited by the routing ability of metal lines.

In accordance with some embodiments of the present disclosure, an integrated circuit includes a semiconductor substrate, an isolation region extending into, and overlying a bulk portion of, the semiconductor substrate, a buried conductive track comprising a portion in the isolation region, and a transistor having a source/drain region and a gate electrode. The source/drain region or the gate electrode is connected to the buried conductive track. In an embodiment, the buried conductive track comprises a portion extending lower than the transistor. In an embodiment, the buried conductive track is connected to the gate electrode, and the integrated circuit further comprises a via underlying the gate electrode and connected to the gate electrode. In an embodiment, the gate electrode is continuously connected to the via, with no interface formed between the gate electrode and the via. In an embodiment, the integrated circuit further includes a source/drain contact plug connected to the buried conductive track. In an embodiment, the integrated circuit further includes an additional via between and connected to the source/drain contact plug and the buried conductive track. In an embodiment, the integrated circuit further includes a dielectric layer including sidewall portions on opposite sides of the buried conductive track, and the sidewall portions have slanted top surfaces; and a bottom portion overlapped by the buried conductive track.

In accordance with some embodiments of the present disclosure, an integrated circuit includes a semiconductor substrate having a bulk portion, and a dielectric layer. The dielectric layer has a bottom portion having a bottom surface contacting a top surface of the bulk portion of the semiconductor substrate; and sidewall portions over the bottom portion, and the sidewall portions are connected to opposite ends of the bottom portion. The integrated circuit further includes a buried metal track over the bottom portion and between the sidewall portions of the dielectric layer; and a dielectric cap overlying and contacting a top surface of the buried metal track. In an embodiment, the bottom portion of the dielectric layer extends into the bulk portion of the semiconductor substrate. In an embodiment, the integrated circuit of claim further includes a shallow trench isolation region having portions on opposite sides of a combined region including the buried metal track and the dielectric layer. In an embodiment, the integrated circuit further includes a semiconductor strip overlying the bulk portion of the semiconductor substrate; and a semiconductor fin overlapping the semiconductor strip, and the semiconductor fin is higher than the shallow trench isolation region, and the buried metal track has a lengthwise direction parallel to a lengthwise direction of the semiconductor fin. In an embodiment, the integrated circuit further includes a transistor including a source/drain region; and a source/drain contact plug having a first portion overlapping the source/drain region, and a second portion at a same level as the source/drain region, and a portion of the buried metal track is overlapped by, and is electrically connected to, the second portion of the source/drain contact plug. In an embodiment, the integrated circuit further includes a transistor having a gate electrode, and the buried metal track is overlapped by, and is electrically connected to, the gate electrode. In an embodiment, the transistor further comprises a gate dielectric, and the buried metal track is connected to the gate electrode through an opening in the gate dielectric.

In accordance with some embodiments of the present disclosure, a method includes etching a semiconductor substrate to form a first trench, filling a metal track into the first trench, forming a dielectric cap covering the metal track, and forming a transistor adjacent to the metal track. The transistor includes a source/drain region; a source/drain contact plug; and a gate electrode, and the metal track has a portion overlapped by one of the source/drain contact plug and the gate electrode. In an embodiment, the portion of the metal track is underlying and connected to the source/drain contact plug through a via. In an embodiment, the via and the source/drain contact plug are formed in a common process. In an embodiment, the portion of the metal track is underlying and connected to the gate electrode through a via. In an embodiment, the via and the gate electrode are formed in a common process. In an embodiment, the method further includes forming a shallow trench isolation region comprising portions on opposite sides of the metal track.

In accordance with some embodiments of the present disclosure, an integrated circuit includes an isolation region, a first semiconductor strip and a second semiconductor strip parallel to each other, and the first semiconductor strip and the second semiconductor strip are in the isolation region, a buried metal track between the first semiconductor strip and the second semiconductor strip; and a first semiconductor fin and a second semiconductor fin overlapping the first semiconductor strip and the second semiconductor strip, respectively. In an embodiment, the integrated circuit further includes a gate electrode crossing over the buried metal track, the first semiconductor fin, and the second semiconductor fin. In an embodiment, the buried metal track is electrically connected to the gate electrode.

In accordance with some embodiments of the present disclosure, a method includes forming a metal track extending into a semiconductor substrate, and the metal track is enclosed by dielectric feature comprising a dielectric layer and a dielectric ca; etching the semiconductor substrate to form a semiconductor strip; depositing a dielectric material to embed the metal track and the semiconductor strip therein; recessing the dielectric material to form shallow trench isolation regions, and the dielectric cap is exposed, and a top portion of the semiconductor strip protrudes higher than top surfaces of the shallow trench isolation regions to from a semiconductor fin; forming a metal gate over a first portion of the semiconductor fin; growing an epitaxy semiconductor region on a second portion of the semiconductor fin; and electrically coupling the metal track to one of the metal gate and the epitaxy semiconductor region. In an embodiment, the metal gate overlaps a portion of the metal track, and the metal track is connected to the metal gate through a via underlying the metal gate. In an embodiment, the via and the metal gate are formed in a common process. In an embodiment, the method further includes forming a source/drain contact plug overlapping both a portion of the epitaxy semiconductor region and a portion of the metal track, and the metal track is connected to the source/drain contact plug through a via underlying the source/drain contact plug. In an embodiment, the via and the source/drain contact plug are formed in a common process.

In accordance with some embodiments of the present disclosure, method includes forming a transistor including a source/drain region having a portion higher than a top surface of an isolation region; forming a buried metal track having a portion lower than the top surface of the isolation region; and connecting the transistor to the buried metal track. In an embodiment, the method further includes forming a dielectric layer encircling the buried metal track in a cross-sectional view of the buried metal track.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
a semiconductor substrate;
an isolation region extending into, and overlying a bulk portion of, the semiconductor substrate;
a buried conductive track comprising a portion in the isolation region;
a dielectric layer comprising a bottom portion directly underlying the buried conductive track;
a transistor comprising a source/drain region and a gate electrode, wherein the gate electrode is connected to the buried conductive track; and
a via underlying the gate electrode and connecting the gate electrode to the buried conductive track.

2. The integrated circuit of claim 1, wherein the buried conductive track comprises a portion extending lower than the transistor.

3. The integrated circuit of claim 1, wherein the gate electrode is continuously connected to the via, with no interface formed between the gate electrode and the via.

4. The integrated circuit of claim 1, wherein the dielectric layer comprises:
   sidewall portions on opposite sides of the buried conductive track, wherein the sidewall portions have slanted top surfaces, and
   the bottom portion is overlapped by the buried conductive track.

5. The integrated circuit of claim 1, wherein the buried conductive track is physically separated from the transistor.

6. The integrated circuit of claim 1, wherein the buried conductive track is lower than a top surface of the isolation region.

7. The integrated circuit of claim 1, wherein the transistor further comprises a gate dielectric underlying the gate electrode, wherein the via penetrates through the gate dielectric.

8. The integrated circuit of claim 1 further comprising: an additional transistor comprising:
   an additional source/drain region over the buried conductive track; and
   a source/drain contact plug connecting the additional source/drain region to the buried conductive track.

9. The integrated circuit of claim 8 further comprising an additional via between and connected to the source/drain contact plug and the buried conductive track.

10. An integrated circuit comprising:
    a semiconductor substrate comprising a bulk portion;
    a dielectric layer comprising:
        a bottom portion having a bottom surface contacting a top surface of the bulk portion of the semiconductor substrate; and
        sidewall portions over the bottom portion, wherein the sidewall portions are connected to opposite ends of the bottom portion;
    a buried metal track over the bottom portion and between the sidewall portions of the dielectric layer;
    a dielectric cap overlying and contacting a top surface of the buried metal track;
    a shallow trench isolation region extending into the semiconductor substrate;
    a semiconductor strip overlying the bulk portion of the semiconductor substrate; and
    a semiconductor fin overlapping the semiconductor strip, wherein the semiconductor fin is higher than the shallow trench isolation region, and wherein the buried metal track has a lengthwise direction parallel to a lengthwise direction of the semiconductor fin.

11. The integrated circuit of claim 10, wherein the bottom portion of the dielectric layer extends into the bulk portion of the semiconductor substrate.

12. The integrated circuit of claim 10 wherein the shallow trench isolation region comprises portions on opposite sides of, and at a same level as, a combined region comprising the buried metal track and the dielectric layer.

13. The integrated circuit of claim 10 further comprising a transistor comprising:
    a source/drain region; and
    a source/drain contact plug having a first portion overlapping the source/drain region, and a second portion at a same level as the source/drain region, wherein a portion of the buried metal track is overlapped by, and is electrically connected to, the second portion of the source/drain contact plug.

14. The integrated circuit of claim 10 further comprising a transistor comprising:
    a gate electrode, wherein the buried metal track is overlapped by, and is electrically connected to, the gate electrode.

15. The integrated circuit of claim 14, wherein the transistor further comprises a gate dielectric, wherein the buried metal track is connected to the gate electrode through an opening in the gate dielectric.

16. A method comprising:
    etching a semiconductor substrate to form a first trench;
    filling a metal track into the first trench;
    forming a dielectric cap covering the metal track; and
    forming a transistor adjacent to the metal track, wherein the transistor comprising:
        a source/drain region;
        a source/drain contact plug; and
        a gate electrode, wherein the metal track comprises a portion overlapped by one of the source/drain contact plug and the gate electrode, wherein the portion of the metal track is underlying and connected to the source/drain contact plug through a via, wherein the via penetrates through the dielectric cap, wherein the via and the gate electrode are formed in a common process.

17. The method of claim 16, wherein the portion of the metal track is underlying and connected to the gate electrode through a via.

18. The method of claim 16 further comprising forming a shallow trench isolation region comprising portions on opposite sides of the metal track.

19. The method of claim 16 further comprising:
    forming a Contact Etch Stop Layer (CESL) and an Inter-Layer Dielectric (ILD) to cover the source/drain region;
    etching the ILD and the CESL for form an opening in the ILD and the CESL; and
    etching a portion of the dielectric cap to extend the opening into the dielectric cap and to reveal the metal track, wherein the via and the source/drain contact plug are both formed in the opening.

20. The method of claim 19, wherein the etching the ILD and the CESL and the etching the portion of the dielectric cap are performed using a same etching mask.

* * * * *